(12) United States Patent
Kim et al.

(10) Patent No.: US 10,667,414 B2
(45) Date of Patent: May 26, 2020

(54) DISPLAY WITH DISPLAY MOUNTING APPARATUS, AND APPARATUS FOR ASSEMBLING THE SAME

(71) Applicant: LG Display Co., Ltd., Seoul (KR)

(72) Inventors: Hanseok Kim, Paju-si (KR); Seungchul Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/048,741

(22) Filed: Jul. 30, 2018

(65) Prior Publication Data

US 2019/0037712 A1 Jan. 31, 2019

(30) Foreign Application Priority Data

Jul. 31, 2017 (KR) .................. 10-2017-0097020

(51) Int. Cl.
*H05K 5/02* (2006.01)
*F16B 23/00* (2006.01)
(Continued)

(52) U.S. Cl.
CPC ......... *H05K 5/0208* (2013.01); *A47F 5/0807* (2013.01); *A47F 5/0876* (2013.01);
(Continued)

(58) Field of Classification Search
CPC .............. G09F 9/3026; G06F 3/1446; F16B 2001/0035; F16B 1/00; H05K 5/0017;
(Continued)

(56) References Cited

U.S. PATENT DOCUMENTS 6,499,907 B1 12/2002 Baur
7,380,765 B2 * 6/2008 Shiff ..................... A47B 97/04
248/124.1
(Continued)

FOREIGN PATENT DOCUMENTS

CN 103366648 A 10/2013
KR 10-0873849 B1 12/2008
(Continued)

OTHER PUBLICATIONS

Korean Notice of Allowance dated Aug. 31, 2018 in counterpart Korean Application No. 10-2017-0097020.
(Continued)

*Primary Examiner* — James Wu
(74) *Attorney, Agent, or Firm* — Morgan, Lewis & Bockius LLP

(57) ABSTRACT

A display panel mounting device is disclosed. The device includes a body with at least one handle having an activation mechanism, and a mounting element operatively connected to the body and having at least one magnet. The mounting element is attachable to a display panel with a metallic element based on the at least one magnet generating a magnetic force to engage with the metallic element and being detachable from the display panel based on the at least one magnet disengaging from the metallic element. The activation mechanism is configured to control generation of the magnetic force by the at least one magnet.

15 Claims, 7 Drawing Sheets

(51) Int. Cl.

| | | |
|---|---|---|
| *G09F 9/302* | (2006.01) | |
| *A47F 5/08* | (2006.01) | |
| *F16B 5/02* | (2006.01) | |
| *F16M 13/02* | (2006.01) | |
| *F16M 11/04* | (2006.01) | |
| *B25B 23/12* | (2006.01) | |
| *F16B 1/00* | (2006.01) | |
| *H01F 7/06* | (2006.01) | |
| *H01F 7/20* | (2006.01) | |
| *H05K 5/00* | (2006.01) | |
| *G06T 7/00* | (2017.01) | |

(52) U.S. Cl.
CPC ............... *B25B 23/12* (2013.01); *F16B 1/00* (2013.01); *F16B 5/02* (2013.01); *F16B 23/00* (2013.01); *F16M 11/04* (2013.01); *F16M 13/022* (2013.01); *G09F 9/3026* (2013.01); *H01F 7/064* (2013.01); *H01F 7/20* (2013.01); *H05K 5/0017* (2013.01); *H05K 5/0021* (2013.01); *H05K 5/0204* (2013.01); *F16B 2001/0035* (2013.01); *G06T 7/001* (2013.01)

(58) Field of Classification Search
CPC .. H05K 5/0021; H05K 5/0204; H05K 5/0208; B25B 23/12; H01F 7/0252; H01F 7/0221; H01F 7/064; H01F 7/20; G06T 7/001
See application file for complete search history.

(56) References Cited

U.S. PATENT DOCUMENTS

| | | |
|---|---|---|
| 9,916,121 B2 | 3/2018 | Xu et al. |
| 2003/0053855 A1 | 3/2003 | Baur |
| 2007/0040089 A1 | 2/2007 | Shiff |
| 2015/0205564 A1 | 7/2015 | Xu et al. |
| 2016/0210886 A1* | 7/2016 | Brashnyk ............. G09F 9/3026 |
| 2016/0255731 A1 | 9/2016 | Ran |
| 2017/0006727 A1 | 1/2017 | Ryu et al. |

FOREIGN PATENT DOCUMENTS

| | | |
|---|---|---|
| KR | 10-0930375 B1 | 12/2009 |
| KR | 10-0948042 B1 | 3/2010 |
| KR | 20-0454111 Y1 | 6/2011 |
| KR | 10-2014-0067771 A | 6/2014 |
| KR | 2015-0105287 A | 9/2015 |
| KR | 10-2017-0000575 A | 1/2017 |
| KR | 20-0483850 Y1 | 6/2017 |

OTHER PUBLICATIONS

European Search Report in the European Patent Application No. 18182912.8 dated Feb. 13, 2019.
Chinese Office Action dated Feb. 3, 2020 in a counterpart Chinese Application No. 201810859392.5.

* cited by examiner

DISPLAY WITH DISPLAY MOUNTING APPARATUS, AND APPARATUS FOR ASSEMBLING THE SAME

This application claims the priority of Korean Patent Application No. 10-2017-0097020 filed on Jul. 31, 2017, in the Korean Intellectual Property Office, which is incorporated herein by reference for all purposes as if fully set forth herein.

BACKGROUND

1. Technical Field

The present disclosure relates to a display mounting apparatus, a display having the display mounting apparatus, and an apparatus and a method for assembling a display module using the display mounting apparatus, and more particularly, to a mounting apparatus in which an engagement portion is not exposed to the outside for connecting a display module, and an apparatus and method for assembling a display module using the same.

2. Description of the Related Art

Generally, a display module is a device for displaying visual information and is used in various fields such as, for example, mobile phones, television, personal digital assistants (PDAs), digital cameras, and computer monitors.

The display module is manufactured in a large scale according to the development of information technology, and a curved surface display module in which a curvature is formed on a surface of the display module is developed and used.

Recently, as shown in FIG. 1, a multi-display device 1 in which a plurality of display modules 10 are connected to extend a display area and a limit of visual information has been used. The multi-display device 1 is provided in a form of a narrow bezel type or a zero bezel type in which there is almost no interval between the plurality of display modules 10 connected to each other.

Further, the multi-display device 1 may include a profile structure body 30 configured to mount the plurality of display modules 10 thereon. The profile structure body 30 may be provided in a grid shaped frame structure to support the plurality of display modules 10.

Since there is almost no interval between the plurality of display modules 10 in the related art multi-display device 1, there is a structural limitation in that the plurality of display modules 10 cannot be coupled to the profile structure body 30 in front of each of the plurality of display modules 10. Accordingly, in case of the related art multi-display device 1, the plurality of display modules 10 are installed to the profile structure body 30 in the rear of the plurality of display modules 10 using engagement members such as bolts, clamps, and the like.

If the plurality of display modules 10 are installed at the profile structure body 30, the multi-display device 1 may be installed on one's feet by embedding the profile structure body 30 in a wall surface or the like, or coupling a separate support member and a housing to the profile structure body 30.

If one of the plurality of display modules 10 needs to be repaired or replaced, it is difficult to separate the one of the plurality of display modules 10 from the related art multi-display device 1 because an engagement portion is not exposed on a front side of the conventional multi-display device 1.

Further, there may be a mechanism tolerance of the related art profile structure body 30 at which the plurality of display modules 10 are installed, and accordingly, it is difficult to perform an alignment operation for accurately arranging the plurality of display modules 10 at the profile structure body 30. Furthermore, since a coupling operation for the plurality of display modules 10 is performed in the rear of the related art multi-display device 1, a coupled state of a front surface of each of the plurality of display modules 10 cannot be determined and thus conditions of the plurality of display modules 10, such as a fully or partially coupled state or an uncoupled state, cannot readily be recognized. This results in a drawback because the conditions of the front side of each of the plurality of display modules 10 should frequently be checked during assembly.

In addition, due to a related art installation structure of each of the plurality of display modules 10, detaching or attaching of each of the plurality of display modules 10 is difficult such that a large amount of work time is required, resulting in deterioration of the overall productivity. Thus, there is an increasing need to improve an installation structure of the plurality of display modules 10.

SUMMARY

Accordingly, embodiments of the present disclosure are directed to a display mounting apparatus that substantially obviate one or more of the problems due to limitations and disadvantages of the related art.

Therefore, it is an objective of the present disclosure to provide an improved mounting apparatus for improving an installation structure of a display module and selectively detaching or attaching singular display modules required for replacement or repair, and an apparatus and method for assembling a display module using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display panel mounting device includes: a body with at least one handle having an activation mechanism; and a mounting element operatively connected to the body and having at least one magnet, the mounting element being attachable to a display panel with a metallic element based on the at least one magnet generating a magnetic force to engage with the metallic element and being detachable from the display panel based on the at least one magnet disengaging from the metallic element, wherein the activation mechanism is configured to control generation of the magnetic force by the at least one magnet.

The mounting element may be attachable to and detachable from the display panel at a front surface of the display panel. Also, the at least one magnet may be additionally configured to act on a mounting structure at a rear surface the display panel, the mounting structure being configured to engage with or disengage from the metallic element at the rear surface of the display panel.

The body and the mounting element may be for attaching the display panel to or detaching the display panel from a tiled display screen configured to accommodate multiple display panels in a tile format with substantially no interval between adjacent display panels. The display panel may be attachable to and detachable from the tile display screen in a first direction other than a lateral direction substantially parallel with the front surface of the display panel.

The first direction may be substantially perpendicular to the front surface of the display panel.

The display panel mounting device may further include an optical or visual verification mechanism connected to the body for verifying attachment or detachment of the display panel to or from the tile display screen.

The mounting element may be located on the body at one or more positions corresponding to corners of the display panel.

The mounting element may include a bearing mechanism configured to interact with the at least one magnet for engaging with and disengaging from the display panel.

In another aspect, a display apparatus includes: a display module to display an image; and a mounting apparatus connected to the display module, the mounting apparatus including at least one interlocked rotational engagement body configured to be rotated by an assembling apparatus located at a front surface of the display module, and connectable to a profile structure body provided at a rear surface of the display module, and a bearing unit having a first wheel attached to the at least one interlocked rotational engagement body and a second wheel attached to one side of the rear surface of the display module, wherein the at least one interlocked rotational engagement body is rotatably connected to the rear surface of the display module.

The interlocked rotational engagement body may include: a disc having a hole in a central portion and an outer circumferential portion attached to the first wheel of the bearing unit; an engagement member having a body connectable to the profile structure body by coupling through the hole of the disc, and a head portion formed at an end portion of the body and held in the disc; and a magnetic member provided at one or more sides of the head portion and configured to rotate the engagement member under influence of a magnetic force.

The disc may include a seating groove to accommodate and hold the head portion and the magnetic member in place in the seating groove.

The display apparatus may be attachable to the profile structure body via the mounting apparatus. The profile structure body may include a plurality of profiles connected to each other; an engagement plate connected to the profiles and having a through-hole corresponding to the engagement member at one side of the engagement plate; and a nut coupling portion provided in a rear portion of the through-hole of the engagement plate for coupling with the engagement member.

The nut coupling portion may include a nut member for coupling with the engagement member; and a nut housing on a rear side of the engagement plate to block surroundings of the through-hole, and configured to accommodate the nut member in a straight upright state.

The bearing unit may include one of a thrust ball bearing having a plurality of balls between the first wheel and the second wheel, and a thrust needle roller bearing having a plurality of truncated conical rollers between the first wheel and the second wheel.

A tiled display screen may comprise the display apparatus of claim 8 and the profile structure body, wherein the at least one interlocked rotational engagement body is coupled to the profile structure body.

In yet another aspect, a display module assembling apparatus includes: a frame to be positioned at a front side of a display module; and at least one rotation module installed at one side of the frame and corresponding to a mounting apparatus positioned at a rear side of the display module, the at least one rotation module being configured to generate an attractive force to the mounting apparatus and to be in close contact with the front side the display module.

The at least one rotation module may include a housing at the frame; a motor inside the housing; and a rotational interlocking portion connected to a rotational shaft of the motor and configured to be rotated by the rotational shaft to rotate a rotational engagement body of the mounting apparatus.

The rotational engagement body of the mounting apparatus may have an engagement member and a magnetic member connected to the engagement member. The rotational interlocking portion may include a magnetic force generation portion configured to generate a magnetic force to the magnetic member to rotate the engagement member.

The display module assembling apparatus may further include a switch at one side of the frame. The magnetic force generation portion may include an electromagnet module, and the switch may be configured to control a supply of electricity to the electromagnet module.

The display module assembling apparatus may further include an alignment unit. The mounting apparatus may be installed at a predetermined position on the display module relative to a corner of the display module. The alignment unit may be configured to sense a corner of an adjacent display module for aligning the at least one rotation module to a position corresponding to the mounting apparatus.

The alignment unit may be configured to determine an interval between the display module and the adjacent display module at the corner of the display module for aligning a position of the display module. The alignment unit may include at least one image capturing unit at one side of the at least one rotation module and configured to capture an image of the corner of the display module, and an image display unit at one side of the frame and configured to display the image captured by the at least one image capturing unit.

In yet another aspect, a method for assembling a display module includes: attaching any of the above-described display panel mounting devices or display module assembling apparatuses to a front surface portion of the display module having a mounting apparatus attached at a rear surface; moving the display module to an attachment position of a front surface portion of a profile structure body using the mounting device or assembling apparatus; and coupling the display panel or the display module to the attachment position.

The attaching may include aligning an attachment position of the display panel or module using an alignment unit of the display panel or module.

The aligning may include aligning a position of the display panel or module while maintaining a constant interval between the display panel or module and adjacent display panels or modules at a corner of the display panel or module through an image display unit of the aligning unit.

The coupling may include rotating an interlocked rotational engagement body of the mounting apparatus provided at the rear surface of the display panel or module in response to a rotation of a rotation module; and coupling the display panel or module to the profile structure body.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Example embodiments of the present disclosure will now be described in detail with reference to the attached drawings. It should be understood that descriptions of details apparent to those skilled in the art may be omitted.

Certain terms are defined herein for easy understanding. Unless specifically defined herein, scientific and technical terms used herein shall have the meanings commonly understood by those skilled in the art. As used herein, the singular forms are intended to include plural forms and vice versa, unless the context clearly indicates otherwise.

Figure 1:
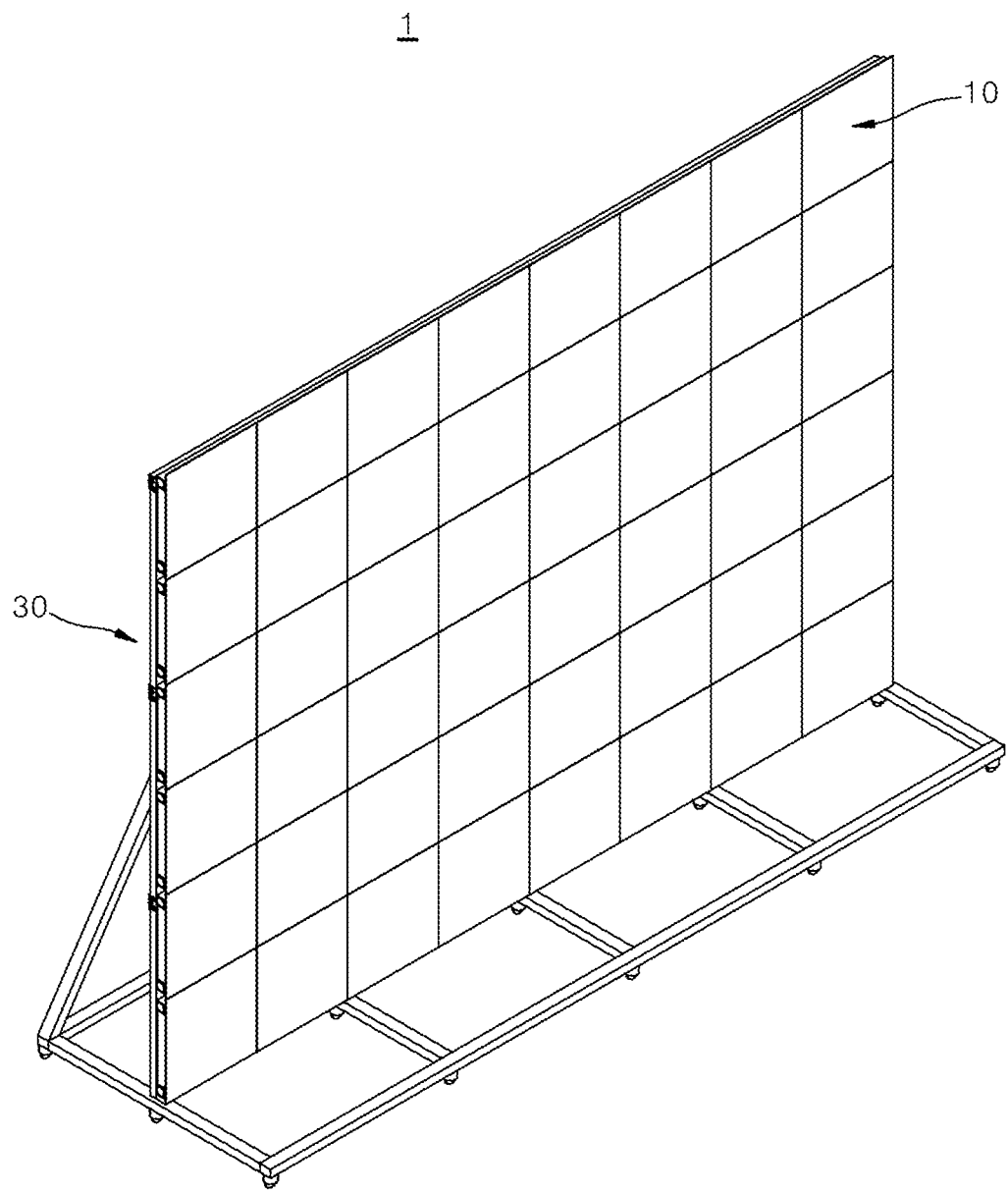
FIG. 1 is a perspective view of a related art multi-display device.
Figure 2:
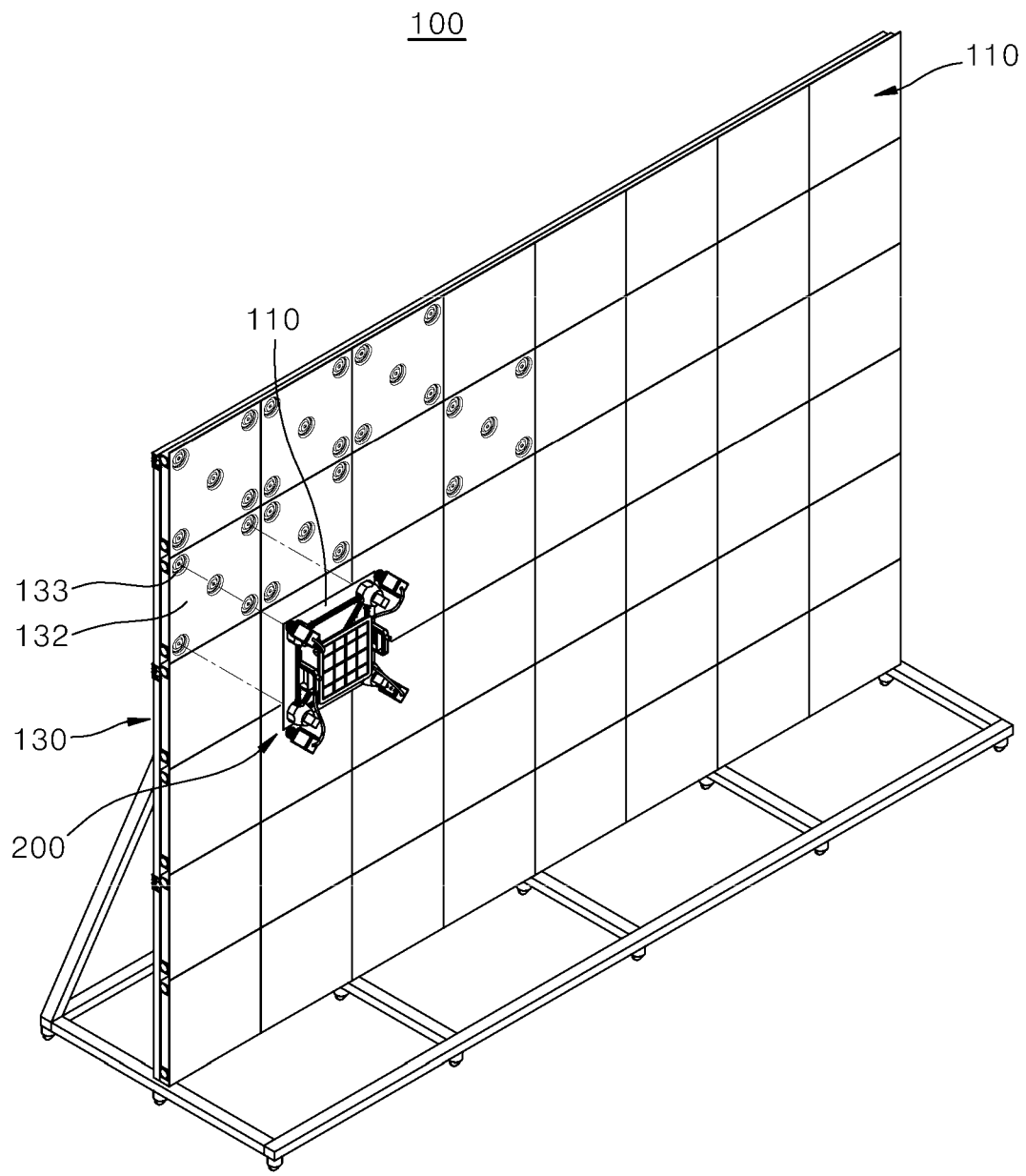
FIG. 2 is a perspective view illustrating a state in which a multi-display device is assembled using an assembling apparatus according to an example embodiment of the present disclosure.
Figure 3:
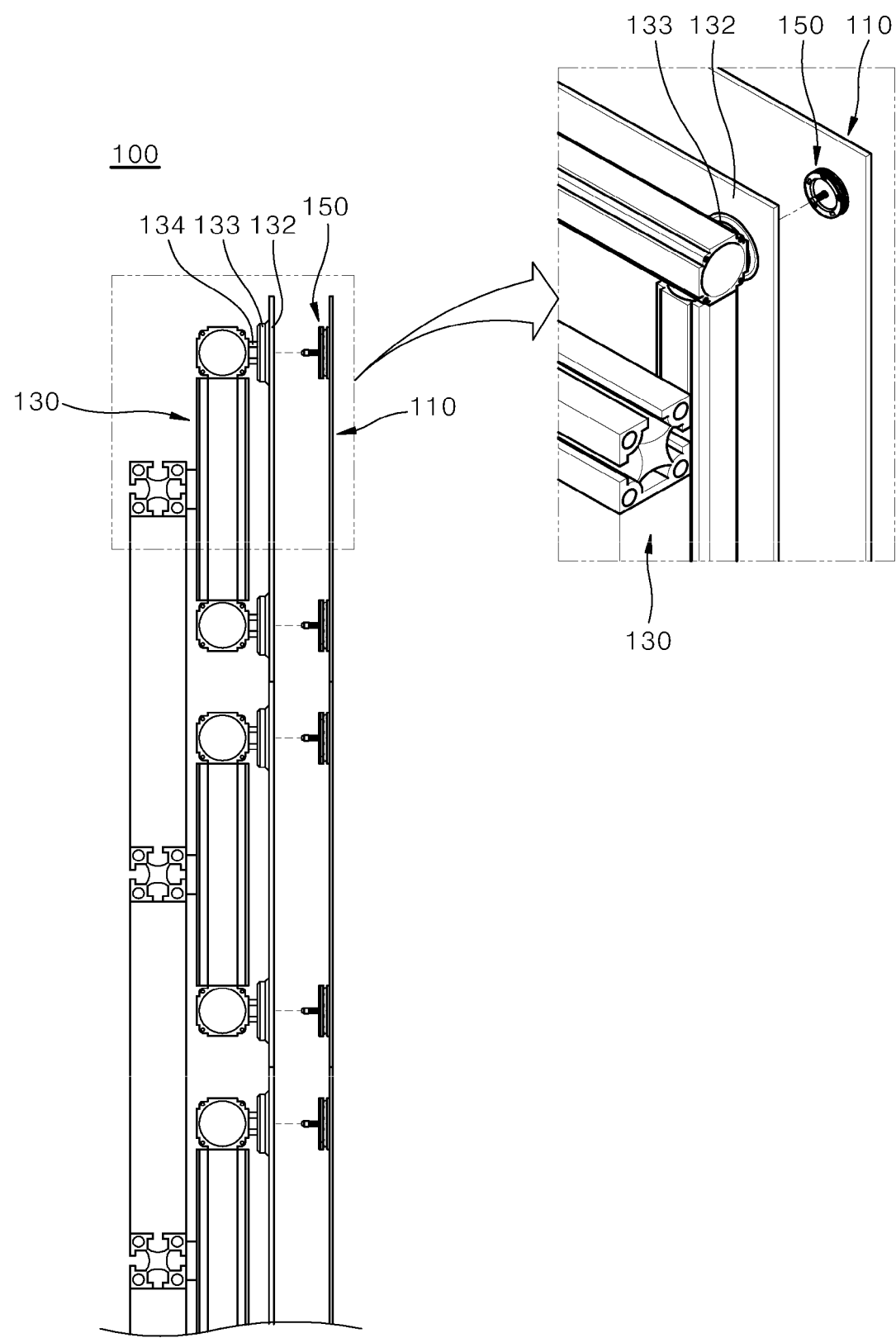
FIG. 3 is a side view illustrating a state in which a multi-display device is assembled using the assembling apparatus according to an example embodiment of the present disclosure.
Figure 4:
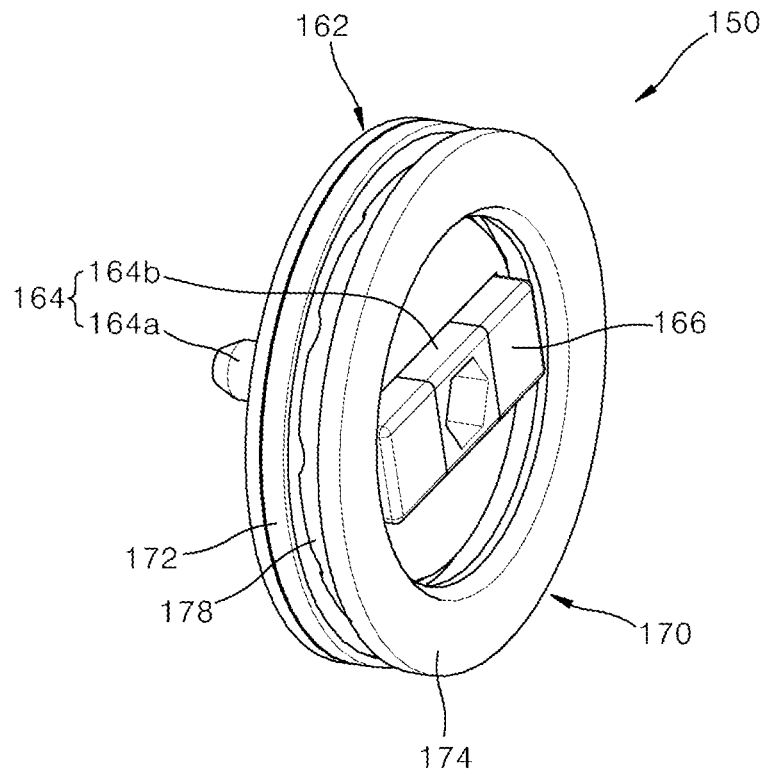
FIG. 4 is a perspective view illustrating a part of a mounting apparatus according to an example embodiment of the present disclosure.
Figure 5:
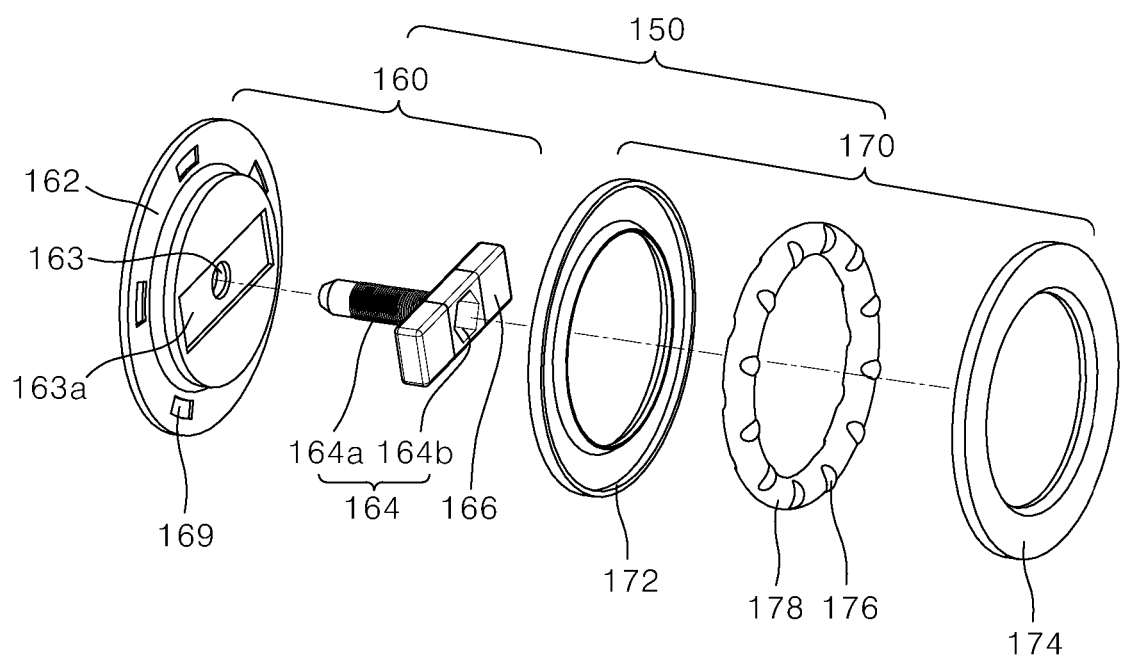
FIG. 5 is an exploded perspective view of a mounting apparatus according to an example embodiment of the present disclosure.

FIG. 2 is a perspective view illustrating a state in which a multi-display device 100 is assembled using an assembling apparatus according to an example embodiment of the present disclosure. FIG. 3 is a side view illustrating a state in which the multi-display device 100 is assembled using an assembling apparatus according to an example embodiment of the present disclosure. Further, FIG. 4 is a perspective view illustrating a part of a mounting apparatus according to an example embodiment of the present disclosure, and FIG. 5 is an exploded perspective view of the mounting apparatus according to an example embodiment of the present disclosure.

Hereinafter, a mounting apparatus 150 and a display module assembly apparatus 200 including the mounting apparatus 150 according to an example embodiment of the present disclosure will be described with reference to FIGS. 2 to 5.

The mounting apparatus 150 according to an example embodiment of the present disclosure is an apparatus configured to couple a display module 110 to a profile structure body 130. The profile structure body 130 may be installed at a wall surface, a place at which the multi-display device 100 is installed, a separate support member, or the like.

Further, a display module 110 may be directly coupled to the profile structure body 130 via the mounting apparatus 150. Also, the profile structure body 130 may include an engagement plate 132 to accommodate a connection with a coupling member, such as a bracket or a nut, which may be provided in the mounting apparatus 150.

An accommodation recess 133 may be formed at the engagement plate 132, and a nut member 134 may be provided at a rear side of the accommodation recess 133 to accommodate a connection with the mounting apparatus 150.

The mounting apparatus 150 may include at least one interlocked rotational engagement body 160. The interlocked rotational engagement body 160 may be coupled to the profile structure body 130 provided at a rear side of the display module 110.

The interlocked rotational engagement body 160 may be rotated by being interlocked with the display module assembly apparatus 200 (shown in FIG. 6) located at a front side of the display module 110. The interlocked rotational engagement body 160 may be provided to be rotated without a physical contact with the display module assembly apparatus 200.

Further, the mounting apparatus 150 may be rotatably coupled to the rear side of the display module 110. To the end, a bearing unit 170 may be provided between the mounting apparatus 150 and the rear surface of the display module 110 and be rotatably coupled with the mounting apparatus 150.

The bearing unit 170 may include a first wheel 172 having one side attached to the interlocked rotational engagement body 160 and a second wheel 174 having one side attached to one side of the rear side of the display module 110. A retainer 178 having a rolling member 176 may be provided between the first wheel 172 and the second wheel 174. FIGS. 4 and 5 illustrate one example of a bearing unit, and other types of known bearings may be employed in the mounting apparatus 150.

The interlocked rotational engagement body 160 may include a disc 162 having an outer circumferential portion attached to the first wheel 172 of the bearing unit 170. An engagement member 164 may be provided at the disc 162 to be coupled to the profile structure body 130. To this end, a through-hole 163 may be formed at a central portion of the disc 162.

A plurality of protrusion parts 169 can be formed on an outer circumferential portion of the disc 162 and they are isolated from each other along the outer circumferential portion of the disc 162. The protrusion parts 169 may protrude away from the display module 110.

When the disc 162 is coupled to its counterpart in the profile structure body 132 by means of a screw or another fastening member, the protrusion parts 169 function to reduce a gap between the components and to increase friction force between them, and thereby help maintaining the coupling between the components.

The protrusion parts 169 can be formed, for example, by use of a press processing or another known process. According to an exemplary embodiment of the present invention, the protrusion parts 169 may be formed in the trapezoid shape, but they are not limited to this shape.

The engagement member 164 may include a body 164a configured to pass through the through-hole 163 of the disc 162, and a head portion 164b formed at a rear end portion of the body 164a and configured to connect to the disc 162, for example, by being slotted into a stepped seating recess 163a of the disc 162, with an adhesive, or with any other known mechanism to hold it in place.

A spiral portion may be formed on an outer circumferential surface of the body 164a and be screw-engaged with the profile structure body 130 by passing through the disc 162. The engagement member 164 may be kept in a state of being coupled to the profile structure body 130 as the head portion 164b is fitted into and is in close contact with the disc 162 while the body 164a is coupled to the profile structure body 130.

A magnetic member 166 may be installed on at least one side of the head portion 164b such that the engagement member 164 may be rotated by a magnetic force. The head portion 164b of the engagement member 164 may be attached to the disc 162 via an adhesive or the like such that the disc 162 and the engagement member 164 may be integrally rotated.

Further, the stepped seating recess 163a may be formed at the disc 162 to allow the head portion 164b and the magnetic member 166 to be slotted into and fixed to the stepped seating recess 163a such that the disc 162 and the engagement member 164 may be more firmly coupled and integrally rotated together.

In an example embodiment, a neodymium magnet may be used as the magnetic member 166, and an electromagnet magnetized by a supply of an induced current may be used in addition to the neodymium magnet. However, other types of magnets may be used.

In an example embodiment, the magnetic member 166 may be symmetrically provided at both sides of the head portion 164b with respect to the center of the head portion 164b. Alternatively, the magnetic member 166 may be provided at only one side of the head portion 164b, or other similar configurations may be used.

Further, in an example embodiment, a plurality of balls may be used as the rolling member 176 between the first wheel 172 and the second wheel 174 of the bearing unit 170, and the bearing unit 170 may include one or more thrust ball bearings configured to support a load generated in an axial direction.

Also, in consideration of a working load and the like, a thrust needle roller bearing having a truncated conical roller may be included in the bearing unit 170 as the rolling member 176 between the first wheel 172 and the second wheel 174.

In addition, the bearing unit 170 may employ any of various types of commercially available bearings, such as an angular bearing and the like, having a self-aligning function while supporting an axial load, instead of or in addition to the thrust ball bearing and the thrust needle roller bearing.

Additionally, in an example embodiment, the interlocked rotational engagement body 160 and the first wheel 172, and the second wheel 174 and the rear surface of the display module 110 may be attached to each other, respectively, via one or more of various mechanisms, for example, an adhesive, the engagement member 164, such as a bolt and the like, another type of engaging member, such as a hook, a bracket, or the like, and welding or the like. The respective coupling structures for the interlocked rotational engagement body 160 and the first wheel 172, and for the second wheel 174 and the rear surface of the display module 110 are not limited to those described above, and the coupling structures may be modified in various forms.

Figure 7:
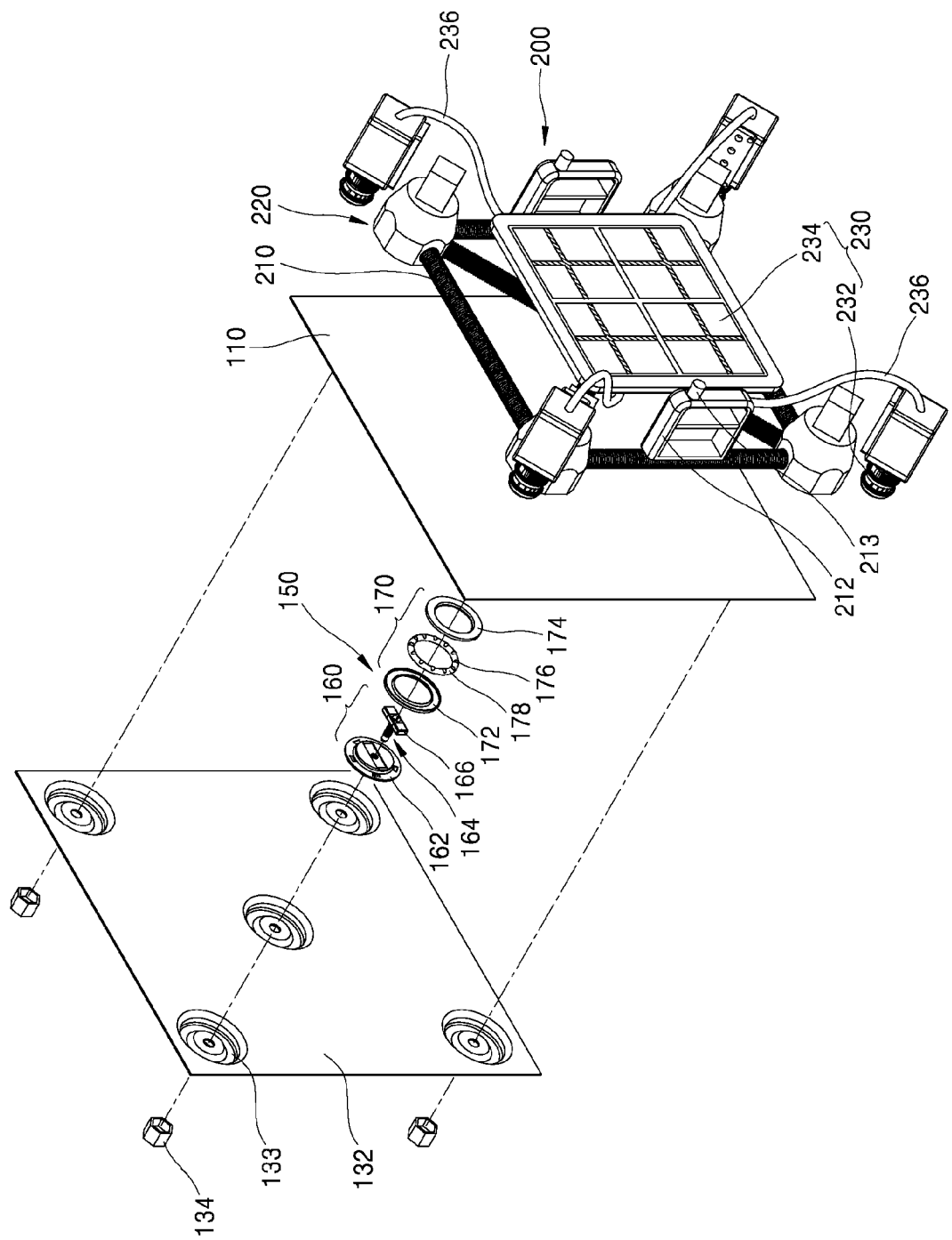
FIG. 7 is a perspective view illustrating a state in which a display module is assembled using a display module assembling apparatus according to an example embodiment of the present disclosure.

As shown in FIG. 7, the mounting apparatus 150 configured as described above may couple the display module 110 to the profile structure body 130 as the interlocked rotational engagement body 160 is rotated by the display module assembly apparatus 200 disposed on the front side of the display module 110.

Figure 6:
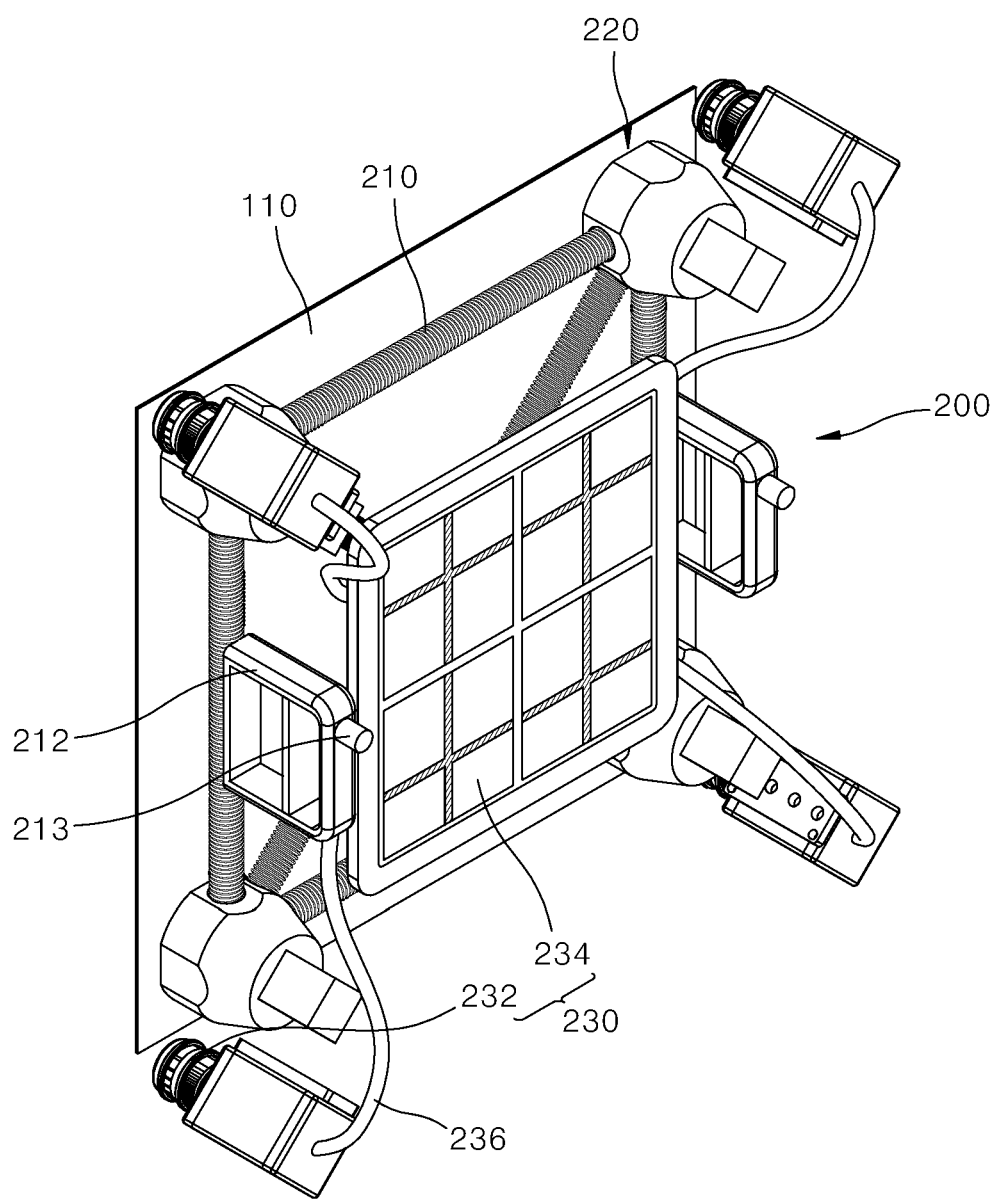
FIG. 6 is a perspective view of a display module assembling apparatus according to an example embodiment of the present disclosure.
Figure 8:
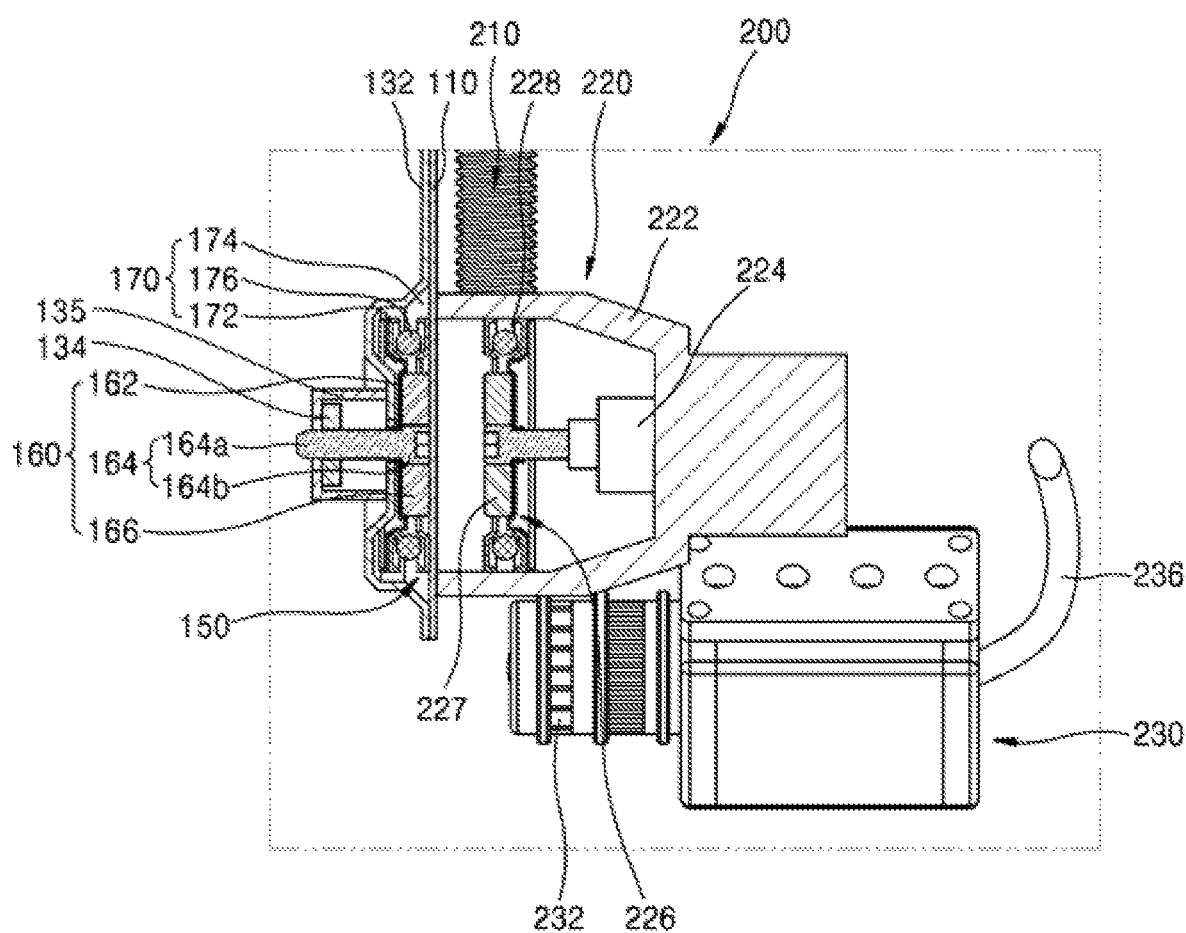
FIG. 8 is a cross-sectional view illustrating a state in which a display module is assembled using a display module assembling apparatus according to an example embodiment of the present disclosure.

FIG. 6 is a perspective view of a display module assembling apparatus according to an example embodiment of the present disclosure. FIG. 7 is a perspective and exploded view illustrating a state in which a display module is assembled using the display module assembling apparatus according to an example embodiment of the present disclosure. FIG. 8 is a cross-sectional view illustrating the state in which the display module is assembled using the display module assembling apparatus according to an example embodiment of the present disclosure.

As illustrated in FIGS. 6 to 8, a configuration of the display assembly apparatus 200 according to an example embodiment is as follows. The display module assembly apparatus 200 may include a frame 210 to be disposed on the front side of the display module 110. Further, at least one rotation module 220 may be provided at one side of the frame 210 and be installed to correspond to the above-described mounting apparatus 150.

The rotation module 220 may generate magnetic force to the mounting apparatus 150, rotate the interlocked rotational engagement body 160 of the mounting apparatus 150 using the magnetic force, and couple or decouple the display module 110 to or from the profile structure body 130.

For example, the mounting apparatus 150 may be fixed to a rear side of the display module 110 at a predetermined position away from a corner of the display module 110. Further, the rotation module 220 of the display module assembly apparatus 200 may be provided at a position corresponding to the mounting apparatus 150 on the front side of the display module 110. Since the rotation module 220 is provided at a position corresponding to the mounting apparatus 150, the display module assembly apparatus 200 may accurately rotate the interlocked rotational engagement body 160.

To this end, the rotation module 220 may include a housing 222 installed at one side of the frame 210. A position of the housing 222 may be adjusted, and the housing 222 may be located at a predetermined position corresponding to the mounting apparatus 150 away from the corner of the display module 110.

Further, a motor 224 may be installed inside the housing 222 via a bracket or the like. In addition, a rotational interlocking portion 226 may be provided at a rotational shaft of the motor 224 to rotate the interlocked rotational engagement body 160 of the mounting apparatus 150.

The rotational interlocking portion 226 may include a magnetic force generation portion 227 configured to generate a magnetic force to the magnetic member 166 of the interlocked rotational engagement body 160 and rotate the engagement member 164.

The magnetic force generation portion 227 may be provided as a permanent magnet or an electromagnet module and have a polarity opposite the polarity of the magnetic member 166 of the interlocked rotational engagement body 160. The magnetic force generation portion 227 may generate an attractive force to the magnetic member 166 of the interlocked rotational engagement body 160, and the magnetic force generation portion 227 of the rotational interlocking portion 226 may be rotated by the motor 224. As the magnetic force generation portion 227 of the rotational interlocking portion 226 is rotated, the magnetic member 166 of the interlocked rotational engagement body 160 may be rotated by the attractive force in response to the rotation of the magnetic force generation portion 227. The engagement member 164 coupled to the magnetic member 166 may also be rotated, and the mounting apparatus 150 may be attached to or detached from the engagement plate 132 of the structure 130.

If the magnetic force generation portion 227 is configured as an electromagnet module, one or more switches 213 may be provided at one side of the frame 210 to control a supply of electricity to the electromagnet module. A handle 212 may be provided at one side of the frame 210 to facilitate an operator to grip the assembly apparatus 200, and the switch 213 may be provided at position of a thumb of the operator so as to allow the operator to control a supply of electricity to the magnetic force generation portion 227, i.e., the electromagnet module in a state in which the operator holds the handle 212.

Although the magnetic force generation portion 227 has been described above as having the polarity opposite the polarity of the magnetic member 166 of the interlocked rotational engagement body 160 in an example embodiment, the magnetic force generation portion 227 may be disposed to have the same polarity as the magnetic member 166. In this alternative configuration, a repulsive force may be generated against a magnetic force generated in the force generation portion 227 such that magnetic member 166 may be rotated.

The rotational interlocking portion 226 may further include an auxiliary bearing unit 228 configured to rotatably support the magnetic force generation portion 227 so as to prevent the magnetic force generation portion 227 from being in contact with the display module 110 while the magnetic force generation portion 227 is rotated.

Although the auxiliary bearing unit 228 has been described above as being installed between the magnetic force generation portion 227 and the housing 222, the auxiliary bearing unit 228 may be provided at various positions for guiding the rotation of the magnetic force generation portion 227. For example, the auxiliary bearing unit 228 may be provided to be in close contact with a front surface portion of the display module 110. Here, a contact pad may be provided at the auxiliary bearing unit 228 to be in soft contact with the front surface portion of the display module 110. Accordingly, the contact pad may minimize or prevent any damage to the display module 110 due to a frictional force between the auxiliary bearing unit 228 and the display module 110. Alternatively, the auxiliary bearing unit 228 may rotatably support a rear side of the magnetic force generation portion 227 without being in close contact with the front side of the display module 110.

The assembly apparatus 200 of an example embodiment may further include an alignment unit 230 configured to align the rotation module 220 to a position corresponding to the mounting apparatus 150 by sensing corners of the display module 110.

For example, the alignment unit 230 may include at least one image capturing unit 232 installed at one side of the rotation module 220 and an image display unit 234 configured to display an image captured by the image capturing unit 232. The image capturing unit 232 and the image display unit 234 may be connected through an electric wire 236, and be connected using wireless communication.

The operator may recognize a position of corners of the display module 110 by checking the image displayed on the image display unit 234. If the image displayed on the image display unit 234 shows that the display module 110 lies at an expected position around the corners, the operator may check an interval between corners of adjacent display modules 110.

When the position of a corner is determined while a position of the display module 110 is aligned, the operator may determine pitches between the outermost pixels of the display module 110 and an adjacent display module 110, which are displayed on the image display unit 234. The operator may align the position of the display module 110 to make the same interval, i.e., the same pitch between the adjacent display modules 110 using the display module assembly apparatus 200.

As described above, when the operator disposes the display module 110 to have a predetermined interval between the adjacent display modules 110 using the image display unit 234, the rotation module 220 may be automatically placed at a position which is accurately aligned with the mounting apparatus 150 installed at the rear side of the display module 110.

The multi-display device 100 may be provided in a form of a narrow bezel type or a zero bezel type in which there is almost no interval between the adjacent display modules 10.

Although the alignment unit 230 has been described above as being aligned by the operator who checks the image captured in the image capturing unit 232 in an example embodiment, the alignment unit 230 may also automatically control the position of the rotation module 220 relative to the display module 110.

To this end, the alignment unit 230 may further include a position correction unit (not shown) configured to move the rotation module 220 to a position corresponding to the mounting apparatus 150 on the basis of the corner captured by the image capturing unit 232.

The position correction unit may include a plurality of variable length members provided between the frame 210 and the rotation module 220. The position of the rotation module 220 may be moved according to a varied length of the plurality of variable length members such that the rotation module 220 may be automatically aligned with the position corresponding to the mounting apparatus 150.

For example, the variable length member may be a member whose length is adjusted by the motor 224, or is adjusted by a cylinder.

Although the mounting apparatus 150 is described above as being coupled to the rear side of the profile structure body 130 via a nut member 134 in an example embodiment, a coupling structure and an engagement structure of the mounting apparatus 150 are not limited to the example described above. These structures may be modified in various forms, and other types of coupling or engagement structures may be employed.

For example, as illustrated in FIGS. 7 and 8, the nut member 134 provided on a rear side of an engagement plate 132 may be movably provided to have a predetermined clearance while the engagement member 164 of the mounting apparatus 150 is coupled to the nut member 134. To this end, a nut coupling portion including the nut member 134 may be provided.

The nut coupling portion may include the nut member 134 to be coupled to the engagement member 164 at the rear side of the engagement plate 132 and to which the mounting apparatus 150 may be fixed. Here, the nut member 134 may be configured to be freely movable in a state of being coupled or attached to the engagement plate 132.

The nut coupling portion may also include a nut housing 135 configured to position the movably provided nut member 134 on the rear side of the engagement plate 132. The nut housing 135 may be provided to block surroundings of the through-hole 163 at the rear side of the engagement plate 132. Further, the nut member 134 may be accommodated inside the nut housing 135.

Here, an inner diameter of the nut housing 135 may be formed to be larger than an outer diameter of the nut member 134, and thus the nut member 134 may be accommodated to move in an inner space of the nut housing 135.

The inner diameter of the nut housing 135 may be formed to be smaller than a maximum thickness of the nut member 134 such that the nut member 134 may move freely in a gap between the nut housing 135 and the engagement plate 132 but may not be laid down in a straight upright state.

In an example embodiment, when a thickness of the nut member 134 is increased, the inner diameter of the nut housing 135 may be made to be larger such that the nut member 134 may be prevented from being laid down. Here, a gap between the nut member 134 and the nut housing 135 may be configured to be larger.

A method for assembling a display module using the above-described mounting apparatus and the above-described display module assembling apparatus using the same will now be described below.

The display module assembly method may include attaching step, moving step, and coupling step.

First, in the attaching step, the mounting apparatus 150 may be installed on the rear side of the display module 110. At this point, the second wheel 174 of the bearing unit 170 of the mounting apparatus 150 may be attached to the rear side of the display module 110 via a member such as an adhesive or the like.

Next, the display module 110 coupled to the mounting apparatus 150 may be disposed close to the profile structure body 130 located behind the display module 110. That is, the operator may move the display module 110 using the display module assembly apparatus 200 and place the display module 110 next to the profile structure body 130 to assemble the display module 110.

When the display module assembly apparatus 200 is positioned on the front side of the display module 110 coupled to the mounting apparatus 150, an attractive force may be generated at the magnetic member 166 of the mounting apparatus 150 by a magnetic force generated at the magnetic force generation portion 227 of the rotation module 220. Thus, the display module 110 may be attached to the rotation module 220 of the display assembly apparatus 200. The magnetic force generation portion 227 of the rotation module 220 may be magnetized to generate the magnetic force by power which is provided when the operator presses the switch 213 attached to the grip 212.

As described above, after the display module 110 is coupled to the display module assembly apparatus 200, the moving step may be performed. The display module 110 may be moved in a state of being attached to the display module assembly apparatus 200 positioned on the front side of the display module 110.

When the display module 110 is attached to the display module assembly apparatus 200, the operator may grip the grip 212 of the display module assembly apparatus 200 and easily move the display module 110 to an attachment position of the profile structure body 130.

Next, in the coupling step, with the use of the display module apparatus 200, the display module 110 may be positioned next to the profile structure body 130 and be coupled to the profile structure body 130.

The coupling step may further include an aligning step to align an attachment position of the display module 110 with the attachment position of the profile structure body 130. The aligning step may align the mounting apparatus 150 with the accommodation recess 133 of the engagement plate 132. At this point, the operator may move the display module 110 to the attachment position of the profile structure body 130 while checking the corner of the display module 110 using the display module assembly apparatus 200.

The mounting apparatus 150 may be installed at a predetermined position on the rear side of the display module 110 near the corner. The mounting apparatus 150 may be aligned with an engagement position of the profile structure body 130 and be mounted at the engagement position, while the operator monitors corners of the display module 110.

The operator may align the display module 110 through the alignment unit 230 of the display module assembly apparatus 200. The alignment unit 230 may capture the corner of the display module 110 and display the captured corner on the image display unit 234.

The operator may determine the corner of the display module 110 displayed on the image display unit 234, align the corner of the display module 110 with corners of adjacent display modules 110 so as to allow the corner of the display module 110 to be kept constant with the corners of the adjacent display modules 110, and determine a position at which the display module 110 is to be mounted on the profile structure body 130.

Specifically, the operator may align the position of the display module 110 by recognizing an interval between the adjacent display modules 110 at the corner of the display module 110 using the alignment unit 230.

As described above, the operator may determine the corner of the display module 110 displayed on the image display unit 234, check and adjust the mounting position of the display module 110, rotate the mounting apparatus 150 using the rotation module 220 of the assembly apparatus 200, and assemble the display module 110 to the profile structure body 130, thereby completing the assembly.

Here, the display module assembly apparatus 200 may rotate the rotation module 220. As the rotation member 220 is rotated, the magnetic member 166 is rotated such that the mounting apparatus 150 attached to the rear side of the display module 110 is rotated. Specifically, in the mounting apparatus 150, the second wheel 174 of the bearing unit 170 may be fixed to the rear side of the display module 110. The first wheel 172 connected to the second wheel via the rolling member 176 may be attached to the disc 162 of the interlocked rotational engagement body 160. The disc 162 may be rotated with the magnetic member 166 while being supported on the first wheel 172.

As described above, the bearing unit 170 may support a rotation of the interlocked rotational engagement body 160 which may be rotated by interlocking with the rotation module 220 via magnetic force. The rotation of the interlocked rotational engagement body 160 is interlocked such that the magnetic member 166 senses attractive force generated in the magnetic force generation portion 227 of the rotation module 220.

A rotational force interlocked with the magnetic member 166 is transmitted to the engagement member 164 and the disc 162 of the interlocked rotational engagement body 160 such that the engagement member 164 is coupled to the engagement plate 132 provided at the profile structure body 130 in a state of being rotatably supported on the first wheel 172.

As described above, in an example embodiment, the display module 110 may be assembled to the profile structure body 130 on the front side of a multi-display device 100 using the display module assembly apparatus 200, and the assembly may be performed while an assembled position, a stepped level, and the like are checked with the naked eye.

In accordance with the present disclosure, a plurality of display modules can be easily attached or detached in a multi-display device at a front surface of the multi-display device. In particular, if a partial repair or replacement is required, a corresponding display module can be selected and removed without an overall disassembly.

Further, in accordance with the present disclosure, since the installation can be performed while the level of assembly of the display module is determined at the front side of the display module, the work can be easily performed. Also, an arrangement state can be adjusted more accurately such that an alignment work can be more accurately and more easily performed.

In addition, in accordance with the present disclosure, since any engagement means or space is not required at the front side of the display module, an interval between the adjacent display modules can be further reduced. Accordingly, a display quality can be improved because distortion of display can be reduced at a border area where the adjacent display modules meet.

Moreover, in accordance with the present disclosure, since the display module can be removed from a multi-display device at the front side of the display module, any additional work at the rear side of the display module is unnecessary. Accordingly, any additional configuration for separating or rotating a profile structure body for any work to be performed at the rear side of the display module is not required. Thus, an entire volume of the display module can be further reduced for better space utilization such that various arrangements and configurations are possible according to an available installation space, and infinite expansion is possible.

Example embodiments of the present disclosure can also be described, without being limited, as follows:

Embodiments relate to a display including a display panel having elements. The display includes a display panel having elements that allow attachment to a mounting structure therebehind and in alignment with adjacent display panels that collectively form a tiled display screen that has multiple display panels connected to each other with effectively seamless bezels, The elements are configured to allow the display panel to be attached to or detached from the tiled display screen in a particular direction other than a side direction that would only allow for engagement from the sides of the adjacent display panels.

In one embodiment, the particular direction is substantially perpendicular to an upper surface of the display panel.

In one embodiment, the elements are configured to have a male-to-female engaging relationship with the mounting structure and to facilitate attachment or detachment.

In one embodiment, the elements are made of metallic material that reacts to magnets in a mounting device used for the attachment or detachment of the display panel to the mounting structure.

In one embodiment, the elements are located near at least four corners of the display panel.

Embodiments also relate to a display panel mounting device including a body with handles and a mounting element. The mounting element is operatively connected to the body and attachable to a display panel due to magnetic forces from magnets in the mounting element upon engagement with metallic elements in the display panel. The mounting element is detachable from the display panel upon disengagement from the metallic elements via a mechanism activated at the handles.

In one embodiment, the magnets additionally act on a mounting structure. The magnets are behind the display panel, and the magnets can be engaged or disengaged with the metallic elements in the display panel.

In one embodiment, the body and the mounting element allow the display panel to be attached to or detached from a tiled display screen, which has multiple display panels connected to each other with effectively seamless bezels, in a particular direction other than a lateral direction that would only allow for slide attachment of the display panel from a side of an adjacent display panel.

In one embodiment, the particular direction is substantially perpendicular to an upper surface of the display panel.

In one embodiment, the mounting element is located on the body at positions corresponding to each corner of the display panel.

In one embodiment, the mounting element further includes a bearing mechanism that cooperates with the magnets for engaging and disengaging with the display panel.

In one embodiment, the display panel mounting device further includes an optical or visual verification mechanism attached to the body to allow verification of attachment or detachment of the display panel.

Embodiments also relate to a mounting apparatus including at least one interlocked rotational engagement body interlocked and rotated with an assembling apparatus located on a front surface of a display module and a bearing unit having a first wheel attached to the at least one interlocked rotational engagement body and a second wheel attached to one side of the rear surface of the display module. The at least one interlocked rotational engagement body is coupled to a profile structure body provided on a rear surface of the display module and rotatably coupled to the rear surface of the display module.

In one embodiment, the interlocked rotational engagement body includes a disc, an engagement member, and a magnetic member. The disc has an outer circumferential portion attached to the first wheel of the bearing unit. And the engagement member has a body coupled to the profile structure body by coupling through a central portion of the disk, and head portion formed at a rear end portion of the body and hooked to the disk. And the magnetic member is at on at least one side of the head portion and configured to rotate the engagement member by a magnetic force.

In one embodiment, the disk includes a seating groove to allow the head portion and the magnetic member to be seated on the seating recess.

In one embodiment, the profile structure body includes a plurality of profiles connected to each other, an engagement plate coupled to the plurality of profiles and having a through-hole corresponding to the engagement member at one side of the engagement plate, and a nut coupling portion at rear portion of the through-hole of the engagement plate. And the engagement member is coupled to the nut.

In one embodiment, the nut coupling portion includes a nut member coupled to the engagement member, and a nut housing on a rear side of the engagement plate to block surroundings of the through-hole, and configured to accommodate the nut member in a state in which the nut member is straight upright.

In one embodiment, the bearing unit includes a thrust ball bearing having a plurality of balls between the first wheel and the second wheel.

In one embodiment, the bearing unit includes a thrust needle roller bearing having a plurality of truncated conical rollers between the first wheel and the second wheel.

Embodiments also relate to a display module assembling apparatus including a frame on a front side of a display module, and at least one rotation module corresponding to a mounting apparatus. The at least one rotation module is installed at one side of the frame to generate attraction to the mounting apparatus and to be in close contact with the display module.

In one embodiment, the at least one rotation module includes a housing at the frame, a motor inside the housing, and a rotational interlocking portion connected to a rotational shaft of the motor and rotated by the rotational shaft to rotate an interlocked rotational engagement body of the mounting apparatus.

In one embodiment, the rotational interlocking portion includes a magnetic force generation portion configured to generate a magnetic force to the magnetic member to rotate an engagement member.

In one embodiment, the magnetic force generation portion includes an electromagnet module, and a switch at one side of the frame to control a supply of electricity to the electromagnet module.

In one embodiment, the mounting apparatus is installed at a specific position on the basis of a corner of the display module. The assembling apparatus further includes an alignment unit to sense a corner of adjacent display module and align the at least one rotation module to a position corresponding to the mounting apparatus.

In one embodiment, the alignment unit recognizes an interval between adjacent display modules at the corner of the display module and aligns a position of the display module. And the alignment unit includes at least one image capturing unit at one side of the rotation module and configured to capture an image of the corner of the display module, and an image display unit at one side of the frame and configured to display an image captured by the at least one image capturing unit.

It will be apparent to those skilled in the art that various modifications and variations can be made in a display mounting apparatus, a display having the display mounting apparatus, and an apparatus and a method for assembling a display module using the display mounting apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
    a display module to display an image; and
    a mounting apparatus connected to the display module, the mounting apparatus comprising:
        at least one interlocked rotational engagement body configured to be rotated by an assembling apparatus located at a front surface of the display module, and connectable to a profile structure body provided at a rear surface of the display module; and
        a bearing unit connected between the at least one interlocked rotational engagement body and the display module, the bearing unit having a first wheel directly attached to the at least one interlocked rotational engagement body, and a second wheel directly attached to the rear surface of the display module and rotatably connected to the first wheel,
    wherein the at least one interlocked rotational engagement body is rotatably connected to the rear surface of the display module via the bearing unit.

2. The display apparatus of claim 1, wherein the interlocked rotational engagement body includes:
    a disc having a hole in a central portion and an outer circumferential portion directly attached to the first wheel of the bearing unit;
    an engagement member having:
        a body connectable to the profile structure body by coupling through the hole of the disc, and
        a head portion formed at an end portion of the body and held in the disc; and
    a magnetic member provided at one or more sides of the head portion and configured to rotate the engagement member under influence of a magnetic force.

3. The display apparatus of claim 2, wherein the disc includes a seating groove in the central portion to accommodate and hold the head portion and the magnetic member in place in the seating groove.

4. The display apparatus of claim 2, wherein the display apparatus is attachable to the profile structure body via the mounting apparatus, and
    wherein the profile structure body includes:
        a plurality of profiles connected to each other;
        an engagement plate connected to the profiles and having a through-hole corresponding to the engagement member at one side of the engagement plate; and
        a nut coupling portion provided in a rear portion of the through-hole of the engagement plate for coupling with the engagement member.

5. The display apparatus of claim 4, wherein the nut coupling portion includes:
    a nut member for coupling with the engagement member; and
    a nut housing on a rear side of the engagement plate to block surroundings of the through-hole, and configured to accommodate the nut member in a straight upright state.

6. A tiled display screen comprising the display apparatus of claim 1 and the profile structure body,
    wherein the at least one interlocked rotational engagement body is coupled to the profile structure body.

7. The display apparatus of claim 1, wherein the interlocked rotational engagement body includes a disc having a hole in a central portion and an outer circumferential portion attached to the first wheel of the bearing unit;
    wherein the outer circumferential portion of the disc includes a plurality of protrusions spaced apart from each other and protruding away from the display module, the protrusions being configured to assist maintaining a connection between the disc and the profile structure body.

8. The display apparatus of claim 1, wherein one of the first wheel and the second wheel includes a through-hole in a center portion and a groove along an outer periphery, and wherein the groove faces the other of the first wheel and the second wheel.

9. The display apparatus of claim 8, wherein the bearing unit further comprises a roller unit in the groove to facilitate a rotational movement between the first wheel and the second wheel.

10. A display apparatus, comprising:

a display module; and a mounting apparatus located on a rear side of the display module, the mounting apparatus comprising:

an interlocked rotational engagement body configured to be coupled to a profile structure body located on a rear side of the display module and configured to be rotated with an assembling apparatus located on a front side of the display module, the interlocked rotational engagement body including:

a disc having a central portion and an outer circumferential portion, the central portion having a through-hole, and an engagement member and a magnetic member fixed to the engagement member; and a bearing unit connected between the disc of the interlocked rotational engagement body and the display module, the bearing unit including:

a first wheel directly attached to the outer circumferential portion of the disc, and a second wheel directly attached to the display module and rotatably connected to the first wheel, wherein the mounting apparatus is configured to be fixed to the profile structure body by a rotational movement of the engagement member induced by a magnetic force acting on the magnetic member.

11. The display apparatus of claim 10, wherein the engagement member comprises a body passing through the through-hole, and wherein a head portion and the magnetic member are configured to be fixed to the disc.

12. The display apparatus of claim 10, wherein the display apparatus is attachable to the profile structure body via the mounting apparatus, wherein the profile structure body includes:

a plurality of profiles connected to each other;

an engagement plate connected to the profiles and having a through-hole corresponding to the engagement member at one side of the engagement plate; and a nut coupling portion provided in a rear portion of the through-hole of the engagement plate for coupling with the engagement member, and wherein the engagement plate is located between the profile structure body and the mounting apparatus.

13. The display apparatus of claim 10, wherein the outer circumferential portion of the disc includes a plurality of protrusions spaced apart from each other and protruding away from the display module, the protrusions being configured to assist maintaining a coupling between the disc and the profile structure body.

14. The display apparatus of claim 10, wherein one of the first wheel and the second wheel includes a through-hole in a center portion and a groove along an outer periphery, and wherein the groove faces the other of the first wheel and the second wheel.

15. The display apparatus of claim 14, wherein the bearing unit further comprises a rolling member in the groove to facilitate a rotational movement between the first wheel and the second wheel.

* * * * *